United States Patent
Palladino (10) Patent No.: US 7,200,543 B2
(45) Date of Patent: Apr. 3, 2007

(54) METHOD FOR FAULT ANALYSIS USING SIMULATION

(75) Inventor: James Palladino, Winona Lake, IN (US)

(73) Assignee: International Truck Intellectual Property Company, LLC, Warrenville, IL (US)

(*) Notice: Subject to any disclaimer, the term of this patent is extended or adjusted under 35 U.S.C. 154(b) by 369 days.

(21) Appl. No.: 10/922,051

(22) Filed: Aug. 19, 2004

(65) Prior Publication Data

US 2006/0041417 A1 Feb. 23, 2006

(51) Int. Cl.
*G06F 17/50* (2006.01)
(52) U.S. Cl. .......................... 703/14; 700/31
(58) Field of Classification Search ............... 703/14, 703/13; 714/741; 700/31; 716/4
See application file for complete search history.

(56) References Cited

U.S. PATENT DOCUMENTS

| | | | | |
|---|---|---|---|---|
| 5,548,539 A | * | 8/1996 | Vlach et al. | 703/6 |
| 5,896,401 A | * | 4/1999 | Abramovici et al. | 714/741 |
| 5,903,580 A | * | 5/1999 | Honmura | 714/741 |
| 6,134,516 A | * | 10/2000 | Wang et al. | 703/27 |
| 6,366,822 B1 | * | 4/2002 | Heavlin | 700/31 |
| 7,103,859 B2 | * | 9/2006 | Yamada | 716/4 |

OTHER PUBLICATIONS

Barkal, Joseph, "Automatic Generation of a Diagnostic Expert System from Failure Mode and Effects Analysis (FMEA) Information," 1999-01-0060, Society of Automotive Engineers, Inc.

* cited by examiner

*Primary Examiner*—Albert W. Paladini
(74) *Attorney, Agent, or Firm*—Jeffrey P. Calfa; Gerald W. Askew; Susan L. Lukasik (57) ABSTRACT

A utility for enhancing the interface of a electronic circuit simulator provides for selecting signals for monitoring, selecting groups of components for variation of tolerances and inserting faults to an underlying model of the circuit.

9 Claims, 11 Drawing Sheets

METHOD FOR FAULT ANALYSIS USING SIMULATION

BACKGROUND OF THE INVENTION

1. Technical Field

The invention relates generally to simulations of electrical and electronic circuits and more particularly to a method for using such simulations for performing failure mode and effects analysis of motor vehicle electrical systems.

2. Description of the Problem

Failure mode and effects analysis (FMEA), combined with computer based simulation of electrical circuits, has provided engineers a valuable virtual tool for fault effect and propagation analysis and design verification. An electrical circuit may be modeled using conventional symbols to represent passive and active components. Lines represent the wires that connect components. Components and wires have parameters for which values are specified. Once completed the model is used by the program to emulate a system design. The system's normal limits of operation are readily estimated and by introducing faults to the circuit and determining whether the fault generates a failure, engineers are aided in providing robust, fault tolerant systems for the motor vehicle industry. The emulation tool can provide a detailed map in spreadsheet format for evaluation of simulation runs.

The generation of useful data is eased for engineers by providing them the ability to model efficiently and accurately an electrical system. Engineers would be further assisted by gaining the ability to incorporate component tolerances into the analysis to obtain the expected normal operating limits and by gaining the ability to alter the circuit topology to emulate the introduction of faults. Providing an intuitive and easy to use interface for accomplishing these latter two tasks would be valuable.

System performance is determined by obtaining the system's operating variables in terms of signal voltage and current levels, over time, at strategic nodes in the circuit. However, in terms of specification of device tolerances for a system intended for mass production, normal variation of component operating parameter values is as of much or more interest than is operation of an ideal circuit. Real devices vary in quality and seldom operate in the same environment. Operating data is expected to vary over a range of values and accordingly evaluation of a circuit typically involves repeated simulation runs.

Typically the limits of range in output values is estimated through setting component parameters to the upper and lower limits of their tolerances. This requires only two runs. However, there is no guarantee that this technique pushes the system to the extremes of operational response since concurrent changes in component parameters may cancel one another. The parameters for individual components may be varied randomly. While this process is readily automated, the approach requires a large number of simulation runs to produce a statistically high level of confidence that the "limits of normal operation" have been found. Another approach is to allow the user to specify component parameters individually and assign those values over runs trusting the user to develop an intuition or heuristic method for selecting changes likely to produce a failure in a given system.

The term "failure" has been a source of confusion. In some cases the term may refer to externally set design limits, and thus be arbitrary. Here it must be determined if the specified tolerances for components are acceptable or whether the system can fail without a component fault.

The invention described here is best employed with the SaberHarness™ mixed signal simulator, which may be used to analyze electrical, mechanical and hydraulic systems. It is labeled a mixed signal simulator due to its integration of two different analysis methods. The first method utilizes algorithms to solve equations associated with analog circuitry. The second method employs event driven states which are useful for modeling digital circuitry.

SaberHarness™ mixed signal simulator is constructed in three layers, the simulator core and first and second levels of user interface. The simulator core operates on command line options and a netlist. The simulator netlist conforms to common computer modeling languages, which provide for interconnectivity and physical modeling. The first level interface (or sketch interface) also provides a conveniently used tool to interact with the simulator and to build a database larger in scope than the netlist. The second level interface (harness), provides a high degree of functionality with the inclusion of specialized models for wires, connectors and splices. Both the harness and sketch interfaces were written to be enhanced by users.

SUMMARY OF THE INVENTION

According to the invention there is provided a software package which provides supplemental interfaces and algorithms to and for a circuit/system simulator. The invention has as a primary objective the prediction of the effect of fault conditions on a motor vehicle electrical system. Other objectives include fault propagation analysis and the determination of non-faulted operating ranges and non-faulted abnormal operating conditions. The preexisting simulator provides a facility for accurately and efficiently modeling a vehicle electrical system and running simulations thereof. The invention provides a new utility to enable a user quickly and efficiently to incorporate component parameter tolerances and to vary those parameters within their tolerances. Analysis can then obtain the expected limits of normal operation, provide the ability to efficiently alter circuit topology to emulate the injection of faults and allow the ability to compare faulted and non-faulted responses. Implementation is through a series of user interface screens which organize the introduction of data, and provide a work around to issues with the simulation program to allow use of the underlying program as an efficient FMEA tool.

Additional effects, features and advantages will be apparent in the written description that follows.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1:
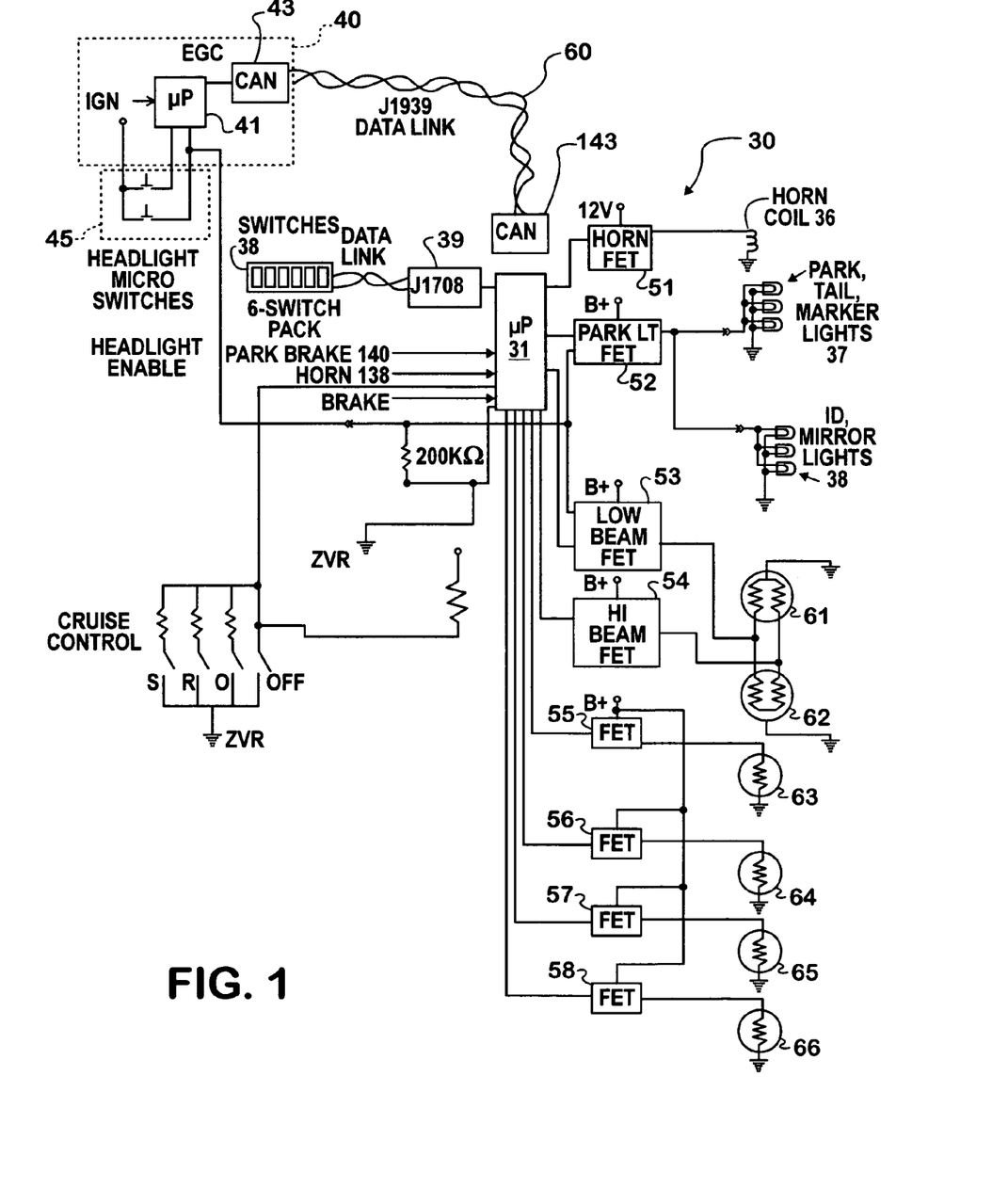
FIG. 1 is a circuit schematic for a representative motor vehicle electrical system, specifically a vehicle exterior lighting system.

Referring now to the figures and in particular to FIG. 1 there is illustrated a vehicle exterior lighting system 30 in a circuit schematic suitable for modeling for evaluation by a commercial circuit and system simulation program, such as the SABRE™ program distributed by Synopsis, Inc. of Mountain View, Calif. Components of the lighting system 30 include an electronic gauge controller (EGC) 40, a microprocessor 31, and a low level circuit schematic of an energization circuit for a plurality of lamps under the control of microcontroller 31. The circuit of FIG. 1 is representative of a device or unit under test (UUT) which may be modeled for simulation within a program such as the SABRE™ system simulator. Microcontroller 31 is typical of a class of programmable body computers used to control many vehicle electrical system functions. Where once dedicated switches, relays and other independently wired and powered devices would have been provided control of various vehicle functions, contemporary design favors use of a microcontroller 31 which executes programs to control switching of a plurality of power FETs which in turn actuate vehicle exterior lights and the horn coil 36 in response to manual actuation of any programmed switch. EGC 40 communicates with microcontroller 31 over an SAE J1939 data link (bus 60) through CAN controllers 43 and 143. EGC 40 is based on a microprocessor 41 but includes only limited and typically fixed programming. EGC 40 handles switch 45 inputs providing manual control over headlights and enablement of the headlights 61, 62. Another source of switch inputs may by provided by a switch pack 38 which is connected to microprocessor over an SAE J1708 bus and controller 39 or through switches associated with brake pedals, turn signal levers and other similar systems. Microcontroller 31 generates control signals of nominal voltages for triggering switching of various field effect switching transistors (FET).

Microcontroller 31 can apply activation signals to any of the lamps 37, 38, 43, 45, 46, 48, 61, 62 as well as to a horn coil 36. In the case of headlights 61, 62 this may also involve pulling high a headlight enable line by instruction to EGC 40. Microcontroller 31 is connected to provide an activation signal to a horn power FET 51 which in turn drives a horn coil 36. Another signal line from microcontroller 31 is connected to drive a park light FET 52 which in turn drives park/tail/marker light bulbs 37, a license plate ID and mirror light bulbs 38. Yet another signal line from microcontroller 31 drives a low beam FET 53, which in turn drives filaments in headlight bulbs 61 and 62. Low beam FET 53 and park light FET 52 further require an input on the headlight enable line to operate. Still another pin on microcontroller 31 controls a high beam FET 54 which drives high beam filaments in bulbs 61 and 62. Lastly, a set of four pins on microcontroller 31 are used to control the turn signal lights at each corner of the vehicle. Four FETs 55, 56, 57 and 58 are connected to receive the signals and, in turn, to power bulbs 63, 64, 65, and 66 mounted in turn signal fixtures at the four corners of the vehicle. FETs 55, 56, 57 and 58 can be activated together or separately to provide turn indications and emergency flasher operation. Full modeling of a circuit will be directed to verifying operation under fault conditions of all of the possible operating modes of the electrical sub-system including adding timing slots for various events to occur.

The Saber™ program is well suited to modeling a subsystem such as lighting subsystem 30. Elements such as FETs 55, 56, 57 and 58 will have gain as a operating parameter which will have a tolerance. Bulbs 61 and 62 will have resistance as a parameter. Similarly, other devices will have some critical parameter subject to variation in the model.

Figure 2:
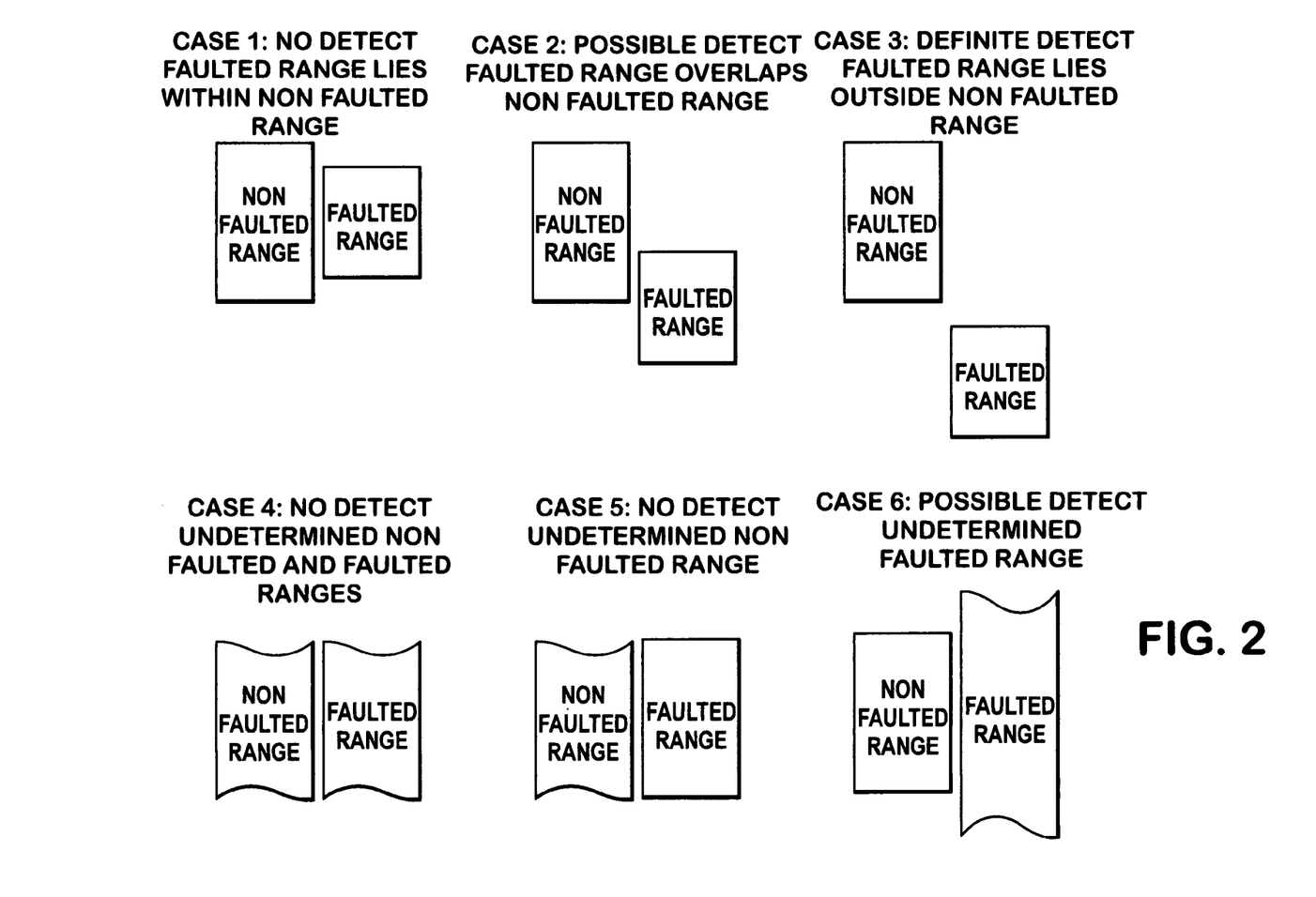
FIG. 2 is a diagrammatic illustration of the logical outcomes of a failure mode and effects analysis.

Referring to FIG. 2, the possible outcomes of the FMEA analysis are logically organized into six possible outcomes. This is done to clarify the definition of systemic failure. There is no logical detection of a failure if the non-faulted range of a system's outcomes lies outside the range of outcomes for a system containing a fault. Nor is there a logical failure if the range of outcomes for non-faulted system is undetermined whether or not limits are determined for the faulted case (outcomes 4 and 5). If the faulted range lies outside the non faulted range definite detection of a logical failure is deemed to have occurred. Finally a possible logical failure results from overlap of the non-faulted and faulted ranges (outcome 2) and from an undetermined faulted range (outcome 6).

The purpose of FMEA is to predict the behavior of a system when a fault or failure occurs, and, if possible, to provide guidance to engineers trying to minimize the effects of faults. Since the combinations of possible faults are very large, the inquiry is limited to probable singular events. For wires this involves three common types of faults: open faults; power faults; and ground faults. The preferred core simulator has no mechanism for fault insertion, requiring the circuit's topology to be varied to simulate the fault. This method, called serial fault insertion, requires at least one simulator run for each fault.

With each simulation of a model with an inserted fault, data is generated at the nodes and compared with data generated at the same nodes for non-faulted runs. If measurements for a simulation run with an inserted fault fall outside values for a non-faulted run a fault at a given node is considered detected. The collection of data at all nodes that show a fault determines the fault propagation and is termed the fault signature. Fault propagation depends upon the nature of a fault and operating variables, e.g. keyswitch on, air conditioning on, etc. Operating variable values for a faulted device produces ranges comparable to values generated for non-faulted runs. Comparison of the faulted range with the non-faulted range produces one of three results. These are: (1) non-detect of a failure; (2) possible failure; or (3) conclusive failure, as graphically shown in FIG. 2. A particular node can be in an undetermined condition, which is taken as a possible failure.

Devices and wires are at times disconnected from a defined source and are said to float. Measurements of floating nodes in actual devices often exhibit erratic behavior, typically from stray electrical and electromagnetic fields or high impedance voltage sources, and can be evaluated as such. In the simulation environment each node has an electrical connection to some source and back to ground. No floating nodes are allowed. Devices which typically open the circuit such as relays, are modeled by giving them a resistance as their operating parameter, with a very low resistance (for example 3 milliohms) modeling a closed relay and an extremely high resistance (for example 3 gigaohms) modeling an open relay. While this allows the simulation to run, it could mask or hide a floating node since the node will still take the value of a driving source. A solution is to model systems in which nodes that potentially float are tied to a predefined high impedance voltage source. The voltage is set well outside the realm of normal system operation (for example 100 volts is the value of the source where a vehicle electrical system typically operates at 12 to 14 volts).

Operating ranges for non-faulted devices are determined using multiple simulator runs. However, doing so for all of the various permutations of faults possible in a given vehicle system is not usually practical. The solution is to take the component parameter values for non-faulted runs which produced the highest average variation in operating range, and reuse those values in the faulted runs. Two simulator runs are required for each inserted fault.

Two types of operating limits are considered for analyzing faults. The estimated limits of normal operation are derived from the simulation runs. The design limits are exogenously provided. An event exceeding an estimated limit of normal operation reflects fault detection and propagation. An event exceeding a design limit reflects a detrimental effect on device operation.

An exemplary system under test may include an HVAC (heating, ventilation and air conditioning) blower that has a design specification for input voltage at its maximum power output. Take the design voltage range for a blower terminal to be 12.5 to 14.0 volts. During normal operation it is observed that voltage input to the HVAC blower remains between 13.0 and 13.8 volts. For purposes of example, when a particular fault is introduced to the system, we can assume the input voltage to the HVAC blower falls to 12.6 volts. Since the fault results in the blower operating at outside its usually observed operating range, a fault is considered detected at the blower, however, because operation remains within design limits no failure is deemed to have occurred.

The foregoing example should clarify how the limits criteria for evaluating fault propagation may differ from the limits criteria defining failure. User supplied design criteria define the thresholds for failure. If no design limits are provided, then the normal operating range data may be substituted.

The methods for isolating faults using operating ranges assume that all factors are accounted for and the model realistically mirrors an actual device. To account for the lack of realism in these assumptions the models are biased, or adjusted, to account for the worst case scenario of error in the model, the simulation, or in the measurements. The methods used are to referred to as "the add tolerance method" and "the minimum tolerance method". The add tolerance method allows for adverse differences between the model and actual devices. The upper and lower limits of the simulation derived operating range are adjusted by a percentage value. For example, if the Add Tolerance factor is 5%, and the estimated operating range is 9.0 to 11.0 volts, the compensated band is about 8.55 volts (9.0×0.95) to about 11.55 volts (11.0×1.05).

Referring to FIGS. 3–9 a new interface for accessing the SABER™ simulation program and varying a model. The new interface provides a series of seven tabs within a window to allow specification of a system, tolerances of components, development of normal operating ranges and introduction of faults to a model to undergo simulated testing. The seven tabs are referred to as the Get Signals tab, the Device Parm tab, the Time Slots tab, the Test Setup tab, the No Fault tab, the Select Faults tab and the Run Faults tab. The Get Signals tab provides the user with a list of possible measurement points from which to select as a set for the test. The Device Pram tab lists all devices on the schematic which have tolerance parameters recognized by the program. The Time Slots tab provides selection of a beginning point of a simulation and points of time into a simulation for measurement of signal levels at given nodes. The Test Setup tab allows the user to set simulation conditions, for example the number of iterations of the simulation to run. The No Fault tab is the interface from which normal operations, i.e. no-fault simulations, are run. The Select Faults tab provides a list of faults available for insertion. The Run Faults tab is an interface from which faulted simulations are run and on which the results are displayed. The program is designed so that data flows from one tab to the next. The order of the tabs corresponds to the order for data entry. A stable circuit schematic is also required. Changes made to the schematic during entry of data, excluding the entry of faults under the Select Faults Tab, may corrupt the test.

Power and ground references must be inserted into the schematic before entry of initial variables and device parameter values. The references may be placed anywhere and they may serve as reference points for short circuit faults. The "vcc" symbol from the SABER™ program library is provided for this purpose. After the symbol is placed in the schematic it may be named, e.g. "BAT_REF" or "GND_REF".

The SABER™ program requires a valid netlist from which to extract data to run simulations. A netlisting operation is done before entry of device parameters and operating variables.

Figure 3:
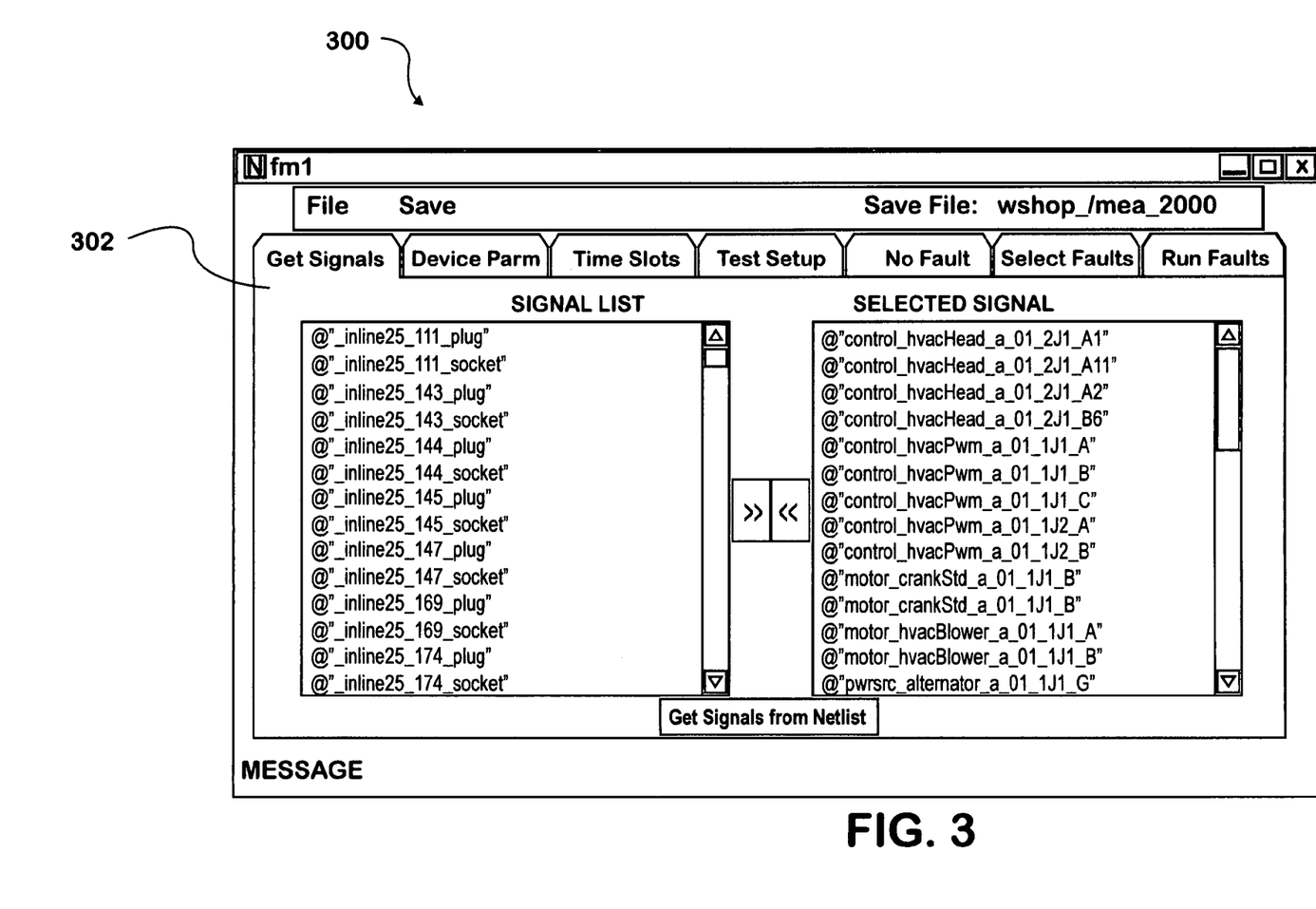
FIG. 3 is a captured screen shot of a tab under a window for implementing the present invention.

Referring more particularly to FIG. 3, the use of the window interface generated by the SABER™ program as modified for implementation of the invention is described. Window 300 is opened to the "Get Signals" tab 302 where a user is allowed to select nodes monitored for signal levels during a simulation test. The possible nodes or signals (Signal List) are listed down the left hand side of the view and the selected signals down the right hand side. The left hand list is populated by selecting the "Get Signals from Netlist" button at the bottom of the two listings. The netlist is in turn populated from the characterization of the circuit or system undergoing testing. The model is a fault capable wire model. Once the Signal List has been populated the user selects signals by moving signals from the left hand side list to the right hand side list (using arrow buttons between the lists). All device pins and harness wires that are part of the model should be included in the signal list.

Figure 4:
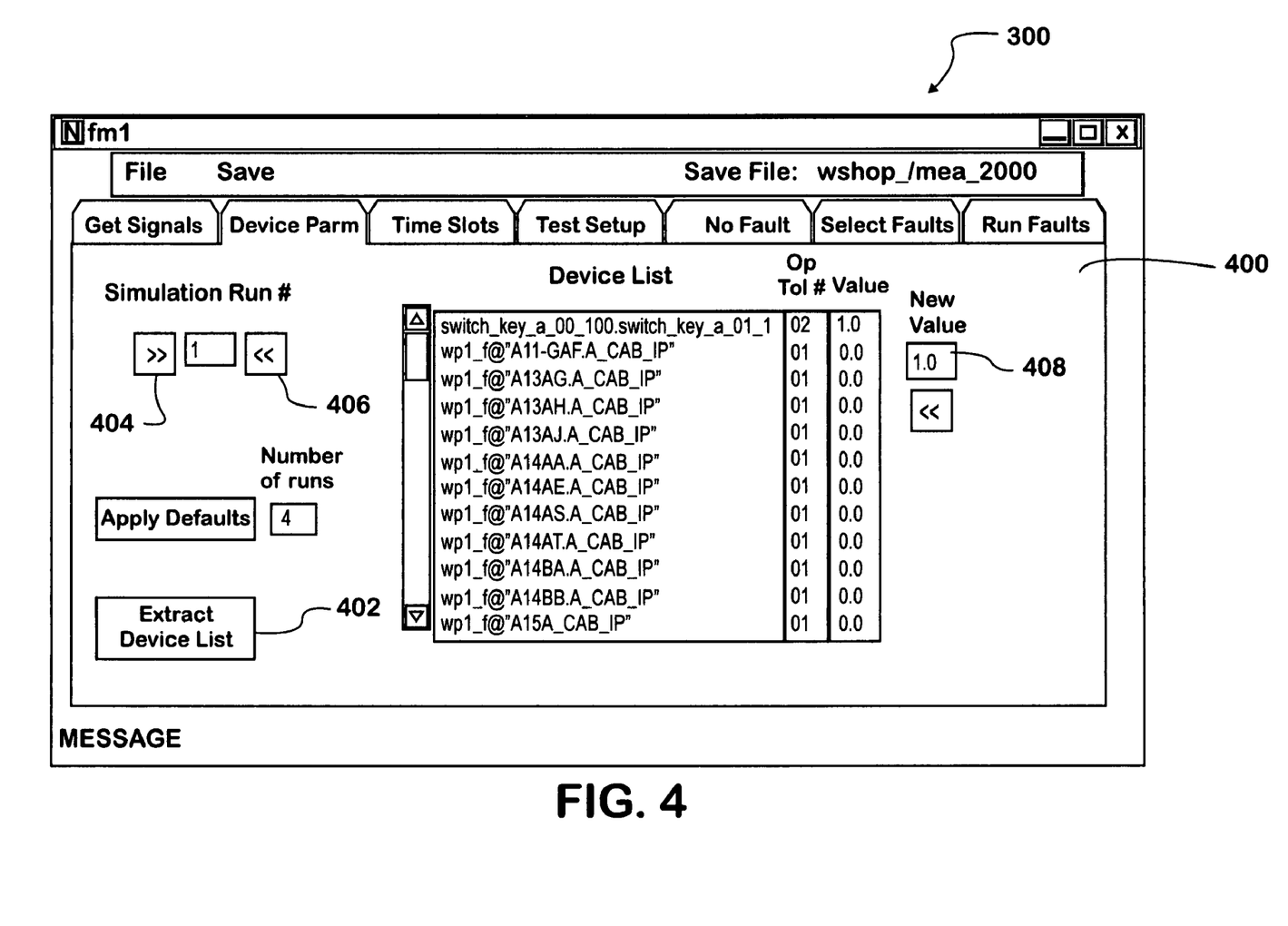
FIG. 4 is a captured screen shot of a tab under a window for implementing the present invention.

The "Device Pram" tab 400 is illustrated in FIG. 4. This tab is used to change component parameters for the components of the model which is to undergo testing, allowing variation to be introduced to the test. The "Extract Device List" 402 lists the devices in the schematic which have been modeled with a special set of global variables used to control component tolerances. These variables are represented in the form "op_tol_xx" where "xx" is "00" to "09". Each component can use as many as 10 variables to specify variation in physical properties of the component within a tolerance band. The band is a continuous function varying between 0 and 2 with 0 being the minimum tolerance, 1 the nominal tolerance and 2 the maximum tolerance. For interconnecting wires and in line connectors the following are specified: (1) op_tol_01=0 for simulation runs 1, 3, 5, 7 etc.; and (2) op_tol_01=2 for simulation runs 2, 4, 6, 8 etc. For components are representative set would be: (1) op_tol_xx=random set 1 for simulation runs 1, 2; (2) op_tol_xx=random set 2 for simulation runs 3, 4; and (3) op_tol_xx=random set x for simulation runs 2x−1, 2x. Random sets are generated with values of 0, 1 or 2. The user has one additional digit of resolution for modification of these values. The user should evaluate the number of simulation runs appropriate for a given design.

The user can view the defaults for all runs by pressing the arrow buttons 404, 406 under the heading "Simulation Run #". Default values are modified by entering a specific value, with a precision to one decimal place, field 408 labeled "New Value". The same tolerances are used for faulted and non-faulted runs.

Figure 5:
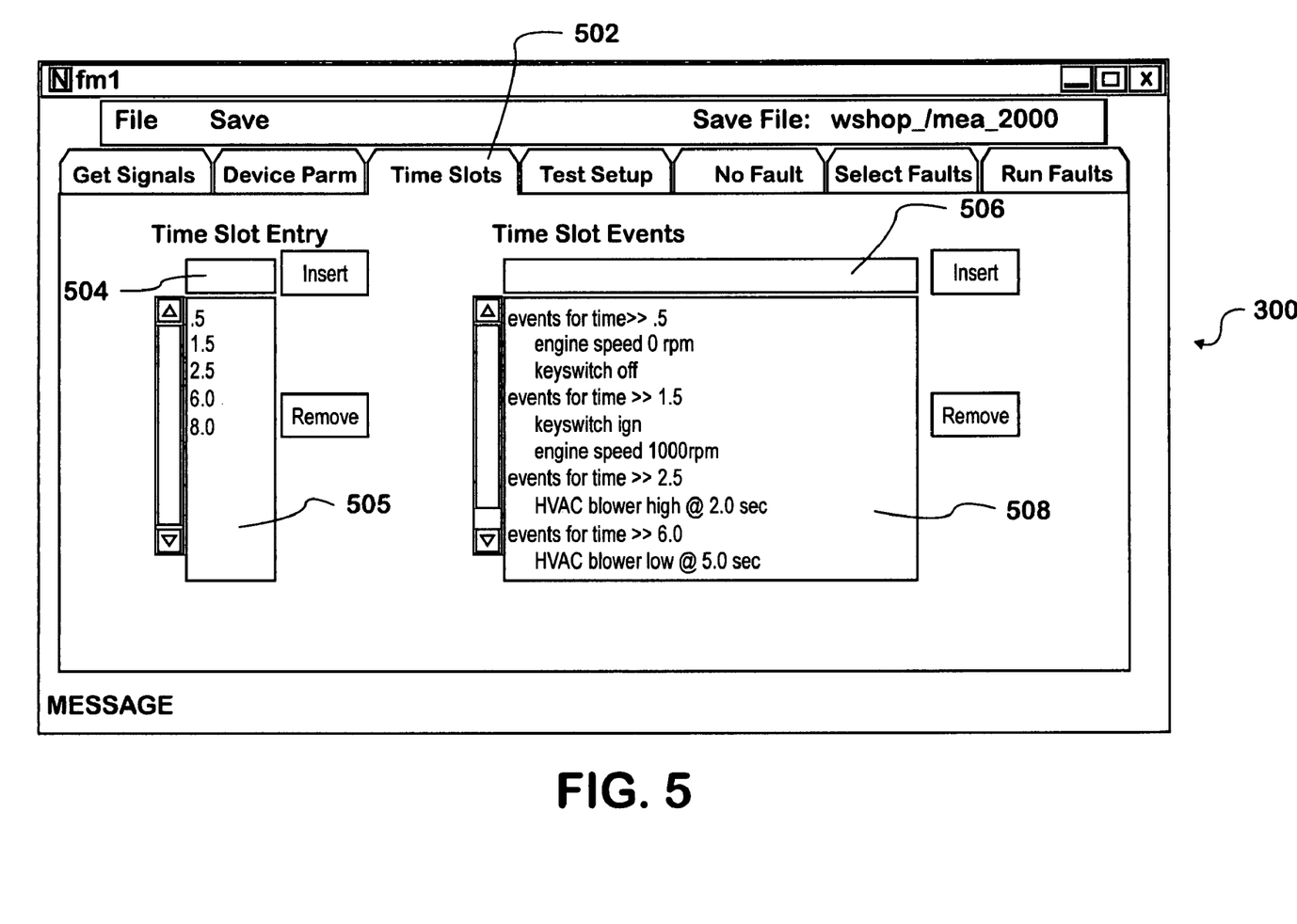
FIG. 5 is a captured screen shot of a tab under a window for implementing the present invention.

Referring to FIG. 5, time slot tab 502 within window 300 allows the user to plan test events and to specify when in a simulation run an event will occur. The tab also allows a user to write documentation through an Events field 506. Events are programmed through changes in the properties of the schematic model of a device. Measurements are taken at points in time within a simulation called "Time Slots", which may be specified in field 504 by selecting an entry from field 505. The events which lead up to a particular time slot are documented in an event specification field 506 pulled from a list 508 or typed by the user into the field. Appropriate navigation control buttons for moving events and time slots between the lists and the fields are provided. For each specified time slot an entry is made in the event log with the details from field 506 being added.

Figure 6:
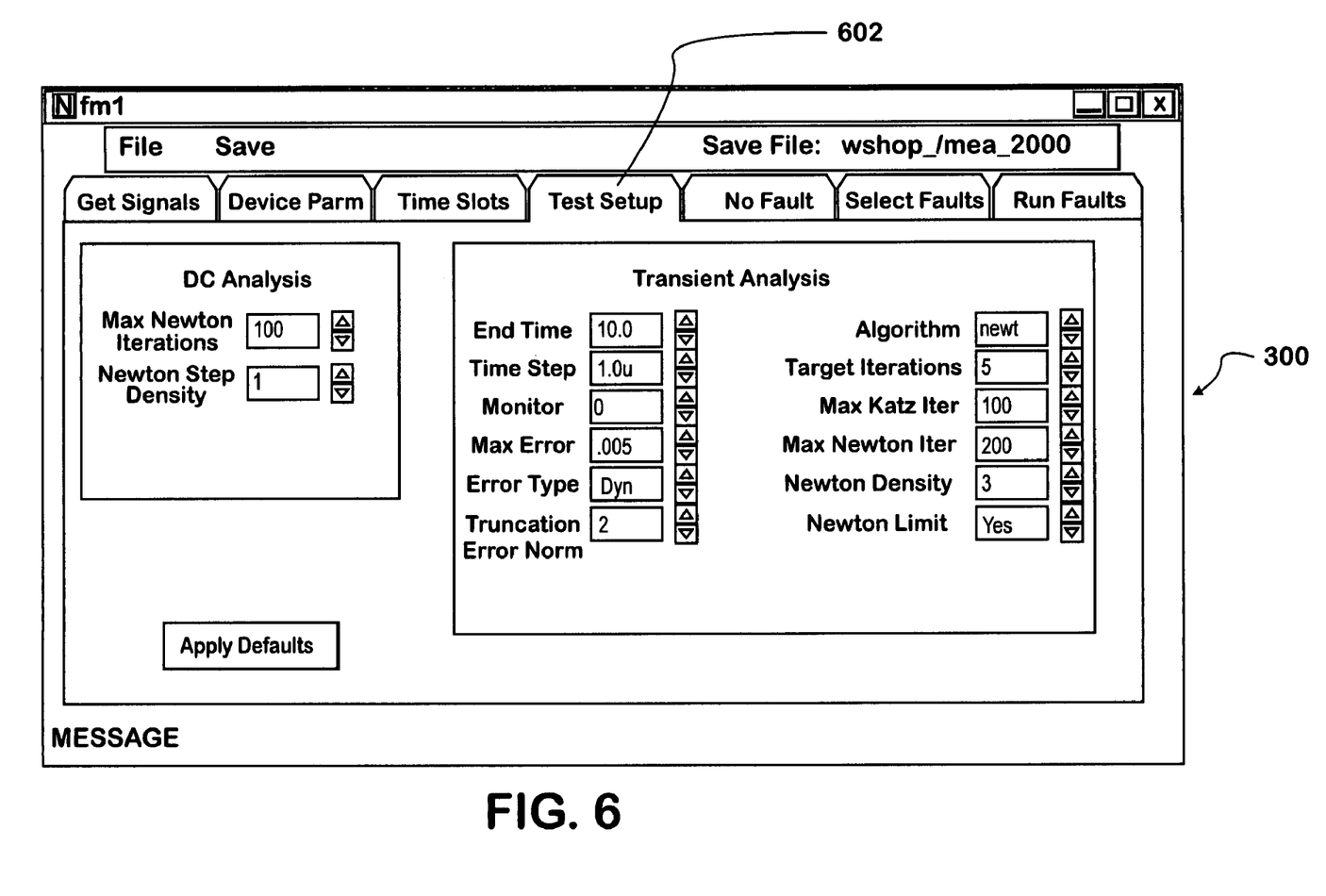
FIG. 6 is a captured screen shot of a tab under a window for implementing the present invention.

FIG. 6 is an illustration of a Test Setup tab 602 within window 300. It is under Test Setup tab 602 that a user sets test variables for a simulation run for direct current and transient analysis.

Figure 7:
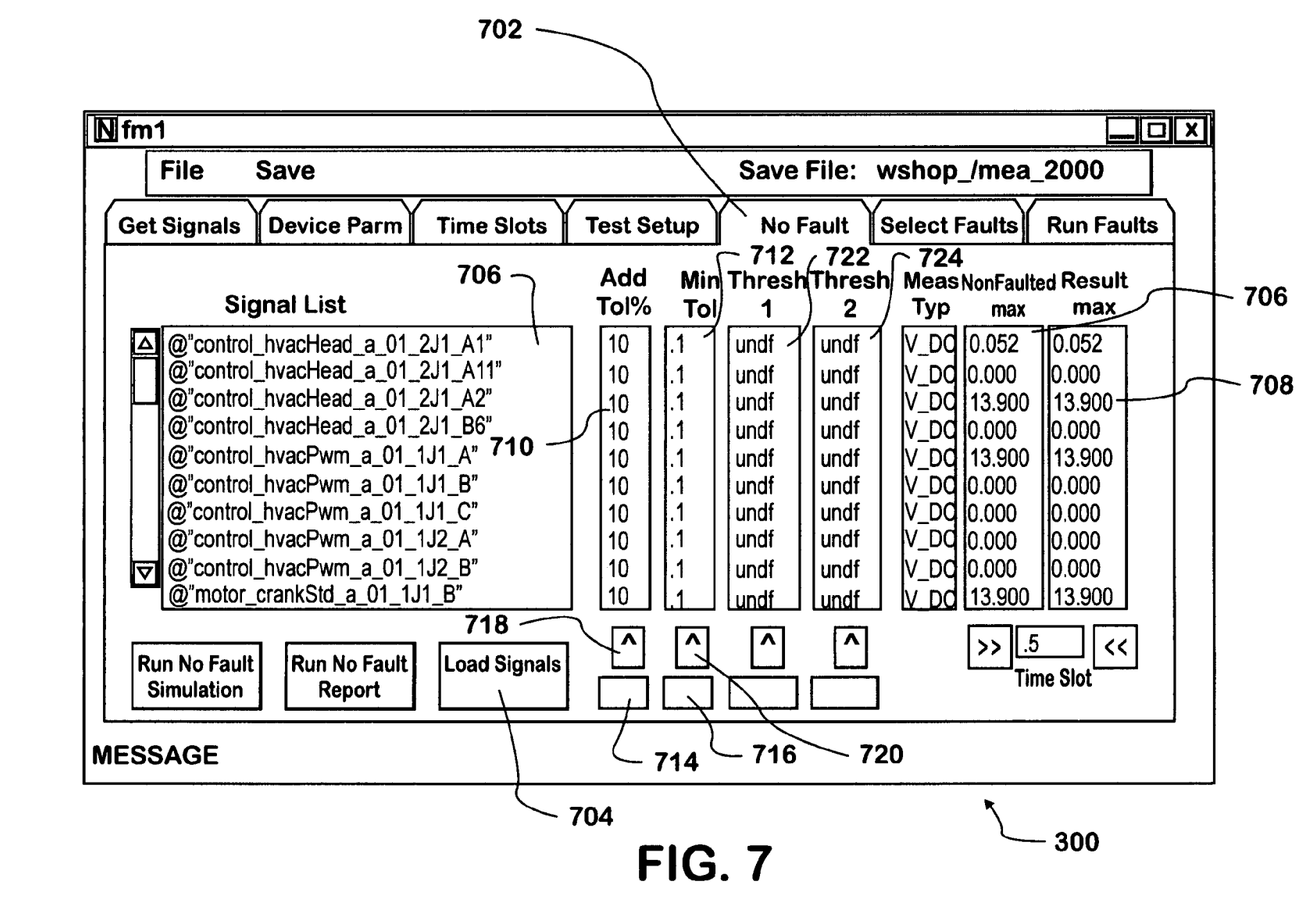
FIG. 7 is a captured screen shot of a tab under a window for implementing the present invention.

FIG. 7 is an illustration of the No Fault tab 702 under window 300 and is used to initiate no-fault simulations. A simulation is initiated by pressing the "Load Signals" button 704 resulting in the program obtaining the signals entered in the signals list from the Get Signals tab and loading the time slot data entered in the time slots tab. No Fault tab 702 is used for establishing the normal range of operation for each of the specified signals (visible in a Signal List field 704). A normal range is determined by running repeated simulations and changing component tolerances before each instance of execution of the simulation. The resulting values for each of the signals listed in field 704 populate Non-Faulted Result fields 706 and 708. The midpoint between the maximum values in field 706 and the minimum value appearing in field 708 may be taken as each signal's nominal value. These ranges will be passed to the Faulted simulation for determining fault propagation. The user can adjust ranges for fault detection by using the Add Tol (add tolerance) and Min Tol (minimum tolerance) fields 710 and 712. Fields 714 and 716 with control buttons 718 and 720 are provided for inserting values to be associated with particular signals listed in field 704. Through the Add Tol field 710 the user widens the range allowed. Minimum tolerance insures that the upper and lower tolerances are at least equal to the values specified. The effects of modifications are displayed in the "Run Faults" tab discussed below.

The Thresh 1 and 2 fields 722 and 724 are provided to allow a user to compare the results of a simulation against design standards, if defined. If the measurement type is dc current and Thresh 1 is used the value specified is interpreted as maximum current. If the measurement type is DC voltage the thresholds are used to form a forbidden zone and to flag any measurements falling into the zone as nonconforming.

Figure 8:
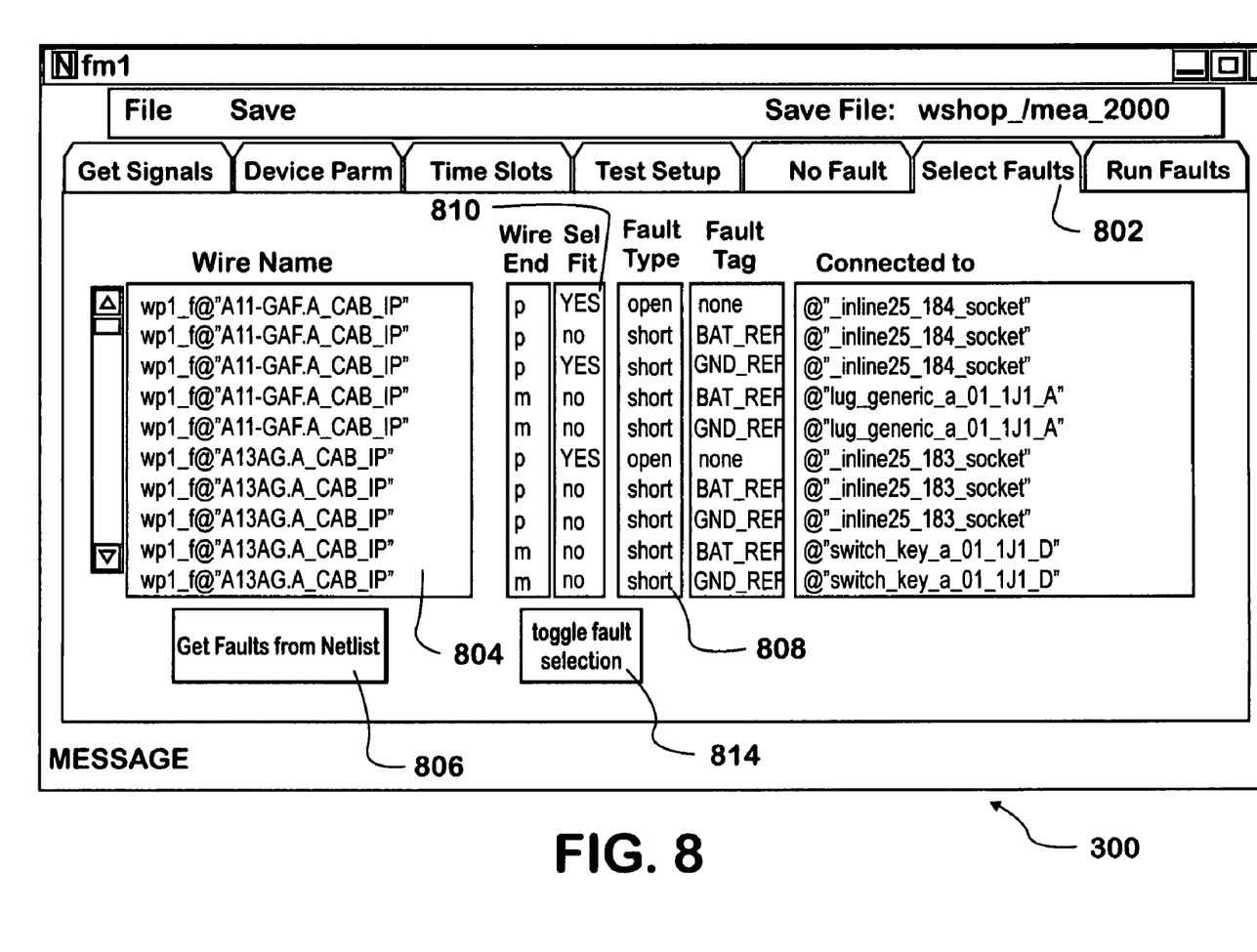
FIG. 8 is a captured screen shot of a tab under a window for implementing the present invention.

FIG. 8 illustrates a Select Faults tab 802 used to select fault modes for insertion to the schematic model. The possible faults are listed in a Wire Name field 804 which is populated by pressing the "Get Faults from Netlist" button 806. Available fault modes (Fault type specified in field 808) include an open wire, or shorts to a reference voltage such as the battery level or ground (BAT_REF and GND_REF, respectively). The shorted fault tags are global markers and must be inserted into the circuit schematic. The insertion point becomes the source of the reference level. Faults can be selected from the list by highlighting the appropriate fault in the Sel Flt field 810 and toggling YES versus NO using toggle fault selection button 814.

Figure 9:
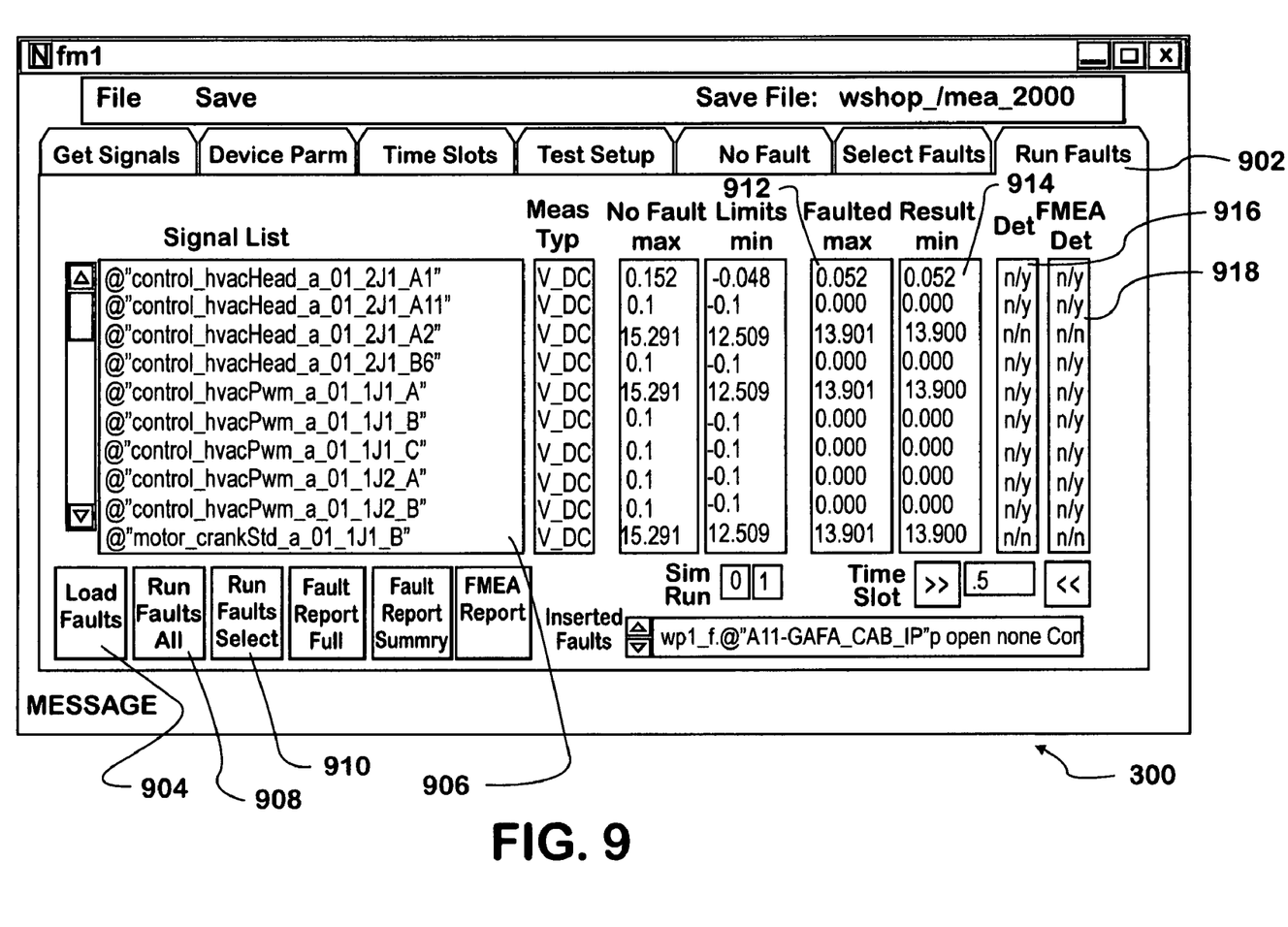
FIG. 9 is a captured screen shot of a tab under a window for implementing the present invention.

Faulted simulations are run from the "Run Faults" tab 902 shown in FIG. 9. Action is initiated by pressing the Load Faults button 904, which transfers signals from the No Fault tab to populate a signals list field 906, faults from the Select Faults field and results in importation of the No Fault limits. It also effects a determination of which run under the No Fault simulations produced the most variation. Two simulation runs are run for each fault.

A user has a choice of running all of the faults or just selected faults from the list of field 906. Multiple faults can be selected. Pressing the "Run Faults All" button 908 or the "Run Faults Select" button 910 starts a simulation run, which consists of serially inserting faults and collecting the resulting data. At the end of a simulation loop faulted maximum and minimum ranges appear in the appropriate fields 912, 914. The utility calculates if a fault was detected or if a failure mode event occurred (fields 916, 918). Appropriate controls allow scrolling of the field for review of the data. Field 916 provides two pieces of information as indicated by the split indicator which may take the any of the values "y/y, n/y, p/y, p/p, n/p, or n/n", where "y" means a definite detection, "n" mean no detection and "p" means a possible detection. Indication is made for the then current time slot on the left side and for any time slot on the right side.

FMEA events are determined in one of two ways. If threshold data are not available, FMEA events are calculated in same way as is fault detection. If threshold data are available, the utility uses the threshold data, the no fault data and the faulted result. The calculation also depends on the measurement type. For example, if the measure type is "I_DC", the program considers the threshold value as the maximum current allowed. Faults that cause currents greater than the threshold flag a failure. If the measure type is "V_DC", the threshold values are treated as zones. The faulted result must occupy the same zone as the non-faulted result, otherwise an event is flagged.

Figure 10:
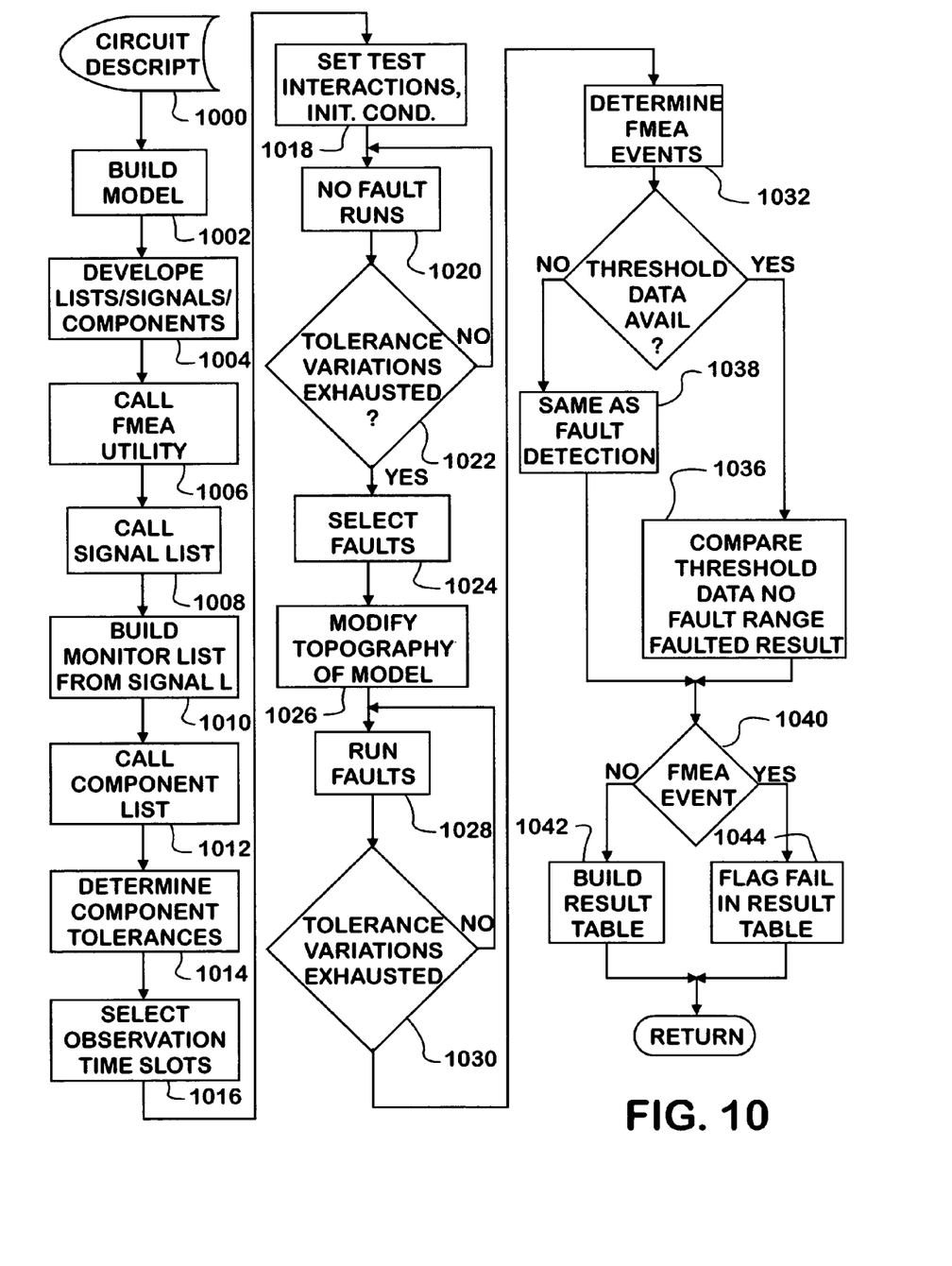
FIG. 10 is a flow chart of the utility program of the present invention.

The process of the present invention may be summarized with reference to the flow chart of FIG. 10. The process starts with the base circuit simulator where a circuit description is imported (step 1000). From the description of the circuit under test a model is built (step 1002) including the development of lists of signals and components. Here the FMEA utility of the present invention is called (step 1006). The signal list is called (step 1008) and a list of signals or nodes is built for monitoring (step 1010). Next the component list is called (step 1012) and the tolerance values for the components are set (step 1014). Conditions for the simulations are completed by selection of observation time slots (step 1016) and setting the number of test iterations (step 1018). Initially a series of no fault runs are made (step 1020) varying the tolerance values for the components as set out above with reference to FIG. 4. Once the desired variations of tolerances are exhausted (step 1022) faults are selected (step 1024) and inserted into the model (step 1026) altering its topology. The simulation is repeated (step 1028) gain, with the new runs incorporating the topological changes represented by the faults, until tolerance variations (by sets) are exhausted (step 1030). Once the faults are exhausted it is determined if the faults gave rise to any FMEA events (step 1032). Initially this involves determining if any threshold data is available (step 1034). If YES, the threshold data, no fault range and results from the faulted runs are compared to generate indication of an FMEA event (step 1040). If No threshold data is available the FMEA detection is done in the same manner as a fault determination (step 1038). Again the result of step 1038 leads to step 1040 for determination of an FMEA event. If there are no FMEA events the result table is built without reference to any failures (step 1042). If there are failures these will be flagged (step 1044).

Figure 11:
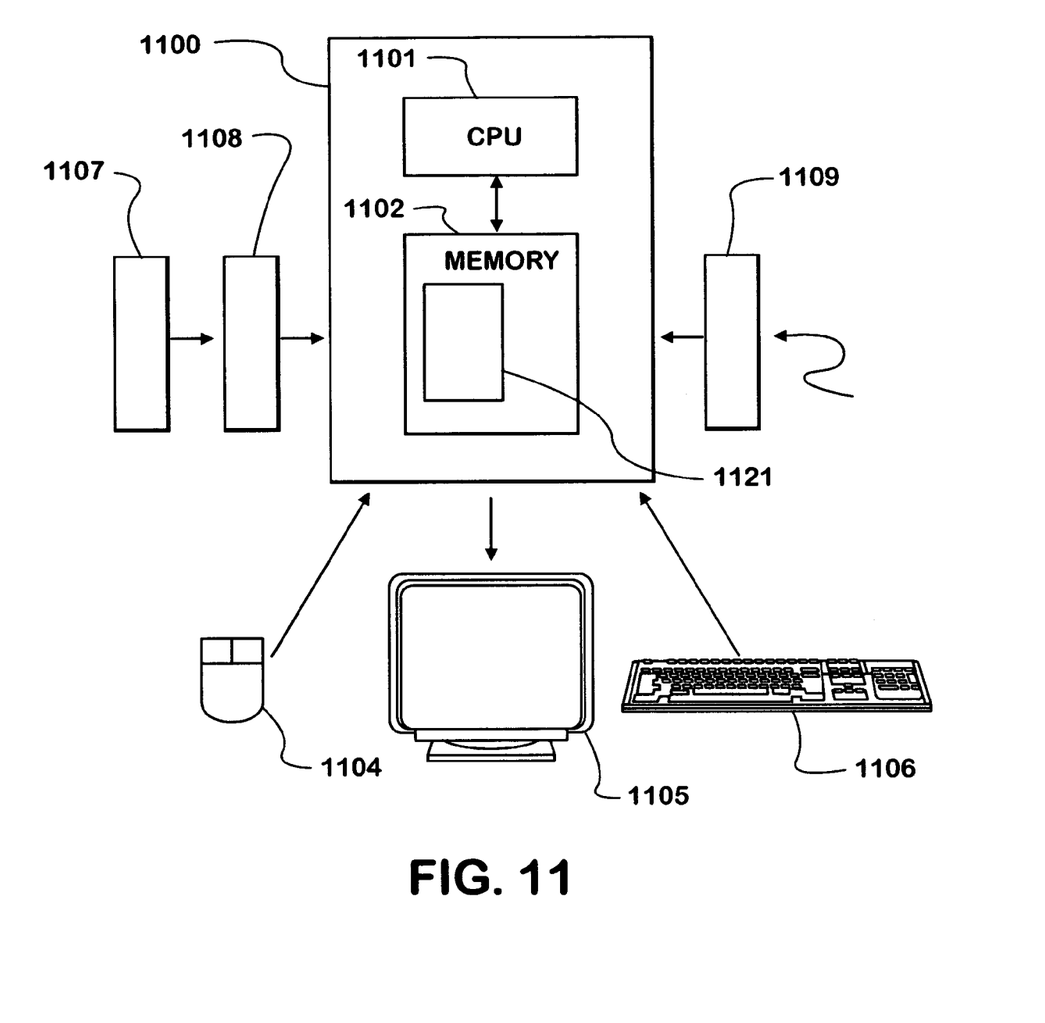
FIG. 11 illustrates a typical computer hardware environment in which software for implementing the present invention in its preferred embodiment is implemented.

Typically the simulation of the model of a circuit such as lighting sub-system 30 of FIG. 1 is executed on a data processing system such as depicted in FIG. 11. FIG. 11 depicts a workstation 1100 comprising a central processing unit 1101 and a memory 1102. Stored in a portion of memory 1102 are software and data 1121 of the present invention. While memory 1102 is depicted as a single, contiguous space, those of ordinary skill in the art will appreciate that such software and data may be distributed over several regions, computers, devices or memory components. Computer 1100 is typically equipped is typically equipped with a display 1105, a puck pointing device 1104 and a keyboard 1106 to provide an user interface. Computer 1100 also includes a reader 1108 for importing information from a readable medium 1107 and a network connection 1109.

The invention provides a method easing entry of fault conditions into a model of an electrical system for purposes of evaluation through simulated operation of the system. Such simulations are used to predict the effects of those faults on complex systems. Three sub-processes define the method including a pre-processor aspect, a simulation control aspect and a post processing aspect. The preprocessor allows for setting up the test, the introduction of variation into the system and the determination of the types and timing of measurements to be made. Simulator control passes parameters and values for variables to the host simulator. Post processing eases analysis.

While the invention is shown in only one of its forms, it is not thus limited but is susceptible to various changes and modifications without departing from the spirit and scope of the invention.

What is claimed is:

1. A method of evaluating electrical systems through failure mode and effects analysis on a model of an electrical system executing as a simulation on a data processing system, the method comprising the steps executed on a data processing system of:

generating a list of possible electrical signals from the model;

prompting a user to select signals from the list of possible electrical signals;

characterizing at least same of the components in the model of the electrical circuit with a set of global variables used to specify component tolerances;

generating and displaying a list of the tolerance controlled components to the user and prompting selection of tolerances for each component;

generating values for the components based on the selected tolerances and running at least two iterations of the model to determine an operating range of the model; and calculating first and second iterations exhibiting the greatest variation in outcomes.

2. The method of claim 1, comprising the further steps of:
for a given iteration of the simulation forcing otherwise undetermined electrical signals to assume a predetermined value.

3. The method of claim 1, comprising the further steps of:
inserting faults to the model;

executing further iterations of the simulation with the inserted faults, varying component tolerances with each iteration;

selecting iterations from the simulations with inserted faults exhibiting the greatest variation; and determining from results of the iterations whether failures occurred.

4. The method of claim 3, comprising the further steps of:
assigning groups of components to like variations to tolerance limits.

5. The method of claim 4, comprising the further steps of:
separating faults into detectable and detrimental classes; and building a results table including flagging failures if any for display to a user of the data processing system.

6. The method of claim 3, comprising the further steps of:
categorizing results of iterations as non detection of failure responsive the range of outcomes for a model with an inserted fault falling within the range of outcomes for the model without faults;

categorizing results of iterations as a possible detection of failure responsive the range of outcomes for the model with an inserted fault overlapping the range of outcomes for the model without faults;

categorizing results of iterations as detection of failure responsive the range of outcomes for the model with an inserted fault falling outside the range of outcomes for the model without faults;

categorizing results of iterations as non detection of failure responsive the range of outcomes for the model with an inserted fault and the range of outcomes for the model without faults being indeterminate;

categorizing results of iterations as non detection of failure responsive the range of outcomes for the model without faults being indeterminate; and categorizing results of iterations as a possible detection of failure responsive the range of outcomes for the model with an inserted fault being indeterminate and the range of outcomes for the model without faults being determinate.

7. The method of claim 1, wherein the step of prompting selection of tolerances provides a selected one of at least two tolerance adjustments including:

adding tolerance and assuming minimum tolerance.

8. The method of claim 1, further comprising the step of:
prompting selection of time slots for determining signal values.

9. A method of implementing fault mode and effects analysis using an electronic circuit simulation program comprising the steps of:

generating a list of circuit signals for monitoring;
selecting component tolerances;
running the simulation program for the electronic circuit iteratively while varying component tolerances to develop operating ranges for the list of circuit signals;
inserting faults to the electronic circuit; and
running the simulation program for the fault modified electronic circuit while varying the component tolerances to determine out of range operation.

* * * * *